US012573463B2

(12) United States Patent
Lee et al.

(10) Patent No.: US 12,573,463 B2
(45) Date of Patent: Mar. 10, 2026

(54) MEMORY DEVICE DETECTING FAIL OF THROUGH-SILICON VIA

(71) Applicant: SK hynix Inc., Icheon-si (KR)

(72) Inventors: Jin Hyung Lee, Icheon-si (KR); Su Hyun Oh, Icheon-si (KR); Chang Kwon Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 11 days.

(21) Appl. No.: 18/798,499

(22) Filed: Aug. 8, 2024

(65) Prior Publication Data

US 2025/0292852 A1      Sep. 18, 2025

(30) Foreign Application Priority Data

Mar. 14, 2024    (KR) ........................ 10-2024-0036097

(51) Int. Cl.
| | |
|---|---|
| *G11C 29/10* | (2006.01) |
| *G11C 5/06* | (2006.01) |
| *G11C 29/02* | (2006.01) |
| *G11C 29/50* | (2006.01) |

(52) U.S. Cl.
CPC ............... *G11C 29/10* (2013.01); *G11C 5/06* (2013.01); *G11C 29/025* (2013.01); *G11C 29/50* (2013.01); *G11C 2029/5006* (2013.01)

(58) Field of Classification Search
CPC . G11C 29/10; G11C 29/50; G11C 2029/5006; G11C 29/32; G11C 29/025; G11C 5/06
See application file for complete search history.

(56) References Cited

U.S. PATENT DOCUMENTS

| | | | |
|---|---|---|---|
| 12,055,586 B1 * | 8/2024 | Kumar | ........... G01R 31/318513 |
| 2011/0080185 A1 * | 4/2011 | Wu | ..................... G01R 31/2601 |
| | | | 257/E23.145 |
| 2012/0212272 A1 * | 8/2012 | Yokou | .................. G11C 29/022 |
| | | | 327/225 |
| 2013/0002272 A1 | 1/2013 | Badaroglu et al. | |

(Continued)

FOREIGN PATENT DOCUMENTS

KR      1020110046894 A      5/2011

OTHER PUBLICATIONS

B. Noia, K. Chakrabarty, S. K. Goel, E. J. Marinissen and J. Verbree, "Test-Architecture Optimization and Test Scheduling for TSV-Based 3-D Stacked ICs," in IEEE Transactions on Computer-Aided Design of Integrated Circuits and Systems, vol. 30, No. 11, pp. 1705-1718, Nov. 2011 (Year: 2011).*

(Continued)

*Primary Examiner* — Cynthia Britt
(74) *Attorney, Agent, or Firm* — WILLIAM PARK AND ASSOCIATES LTD.

(57)      ABSTRACT

A memory device includes a base die and a plurality of core dies stacked over the base die. The base die includes a first base scan control circuit connected to a first node connected to a first through via included in a first column and a second base scan control circuit connected to a second node connected to a second through via included in a second column. The first base scan control circuit sets the first node at a floating state when the first column is selected in a test mode and drives the first node when the second column is selected during the test mode.

24 Claims, 20 Drawing Sheets

10

(56) References Cited

U.S. PATENT DOCUMENTS

| | | | | |
|---|---|---|---|---|
| 2013/0057312 | A1* | 3/2013 | Pagani | H01L 21/76898 |
| | | | | 324/762.01 |
| 2015/0177320 | A1* | 6/2015 | Lee | G01R 31/2803 |
| | | | | 714/727 |
| 2018/0096979 | A1* | 4/2018 | Pappu | G11C 5/025 |
| 2020/0158776 | A1* | 5/2020 | Jeong | G01R 31/2856 |
| 2021/0193623 | A1* | 6/2021 | Oh | G01R 31/2853 |

OTHER PUBLICATIONS

A. Sankararao, V. G and S. R. Malige, "TSV BIST Repair: Design-for-Test Challenges and Emerging Solution for 3D Stacked IC's," 2022 IEEE International Test Conference India (ITC India), Bangalore, India, 2022, pp. 1-6 (Year: 2022).*

E. J. Marinissen, "Challenges in testing TSV-based 3D stacked ICs: Test flows, test contents, and test access," 2010 IEEE Asia Pacific Conference on Circuits and Systems, Kuala Lumpur, Malaysia, 2010, pp. 544-547 (Year: 2010).*

* cited by examiner

FIG. 9

| I-SC = IREF | PASS |
|---|---|
| I-SC < IREF | TSV OPEN |
| I-SC > IREF | TSV SHORT |

FIG. 18

| I-SC = 0 | PASS |
| --- | --- |
| I-SC > 0 | TSV SHORT |

MEMORY DEVICE DETECTING FAIL OF THROUGH-SILICON VIA

CROSS-REFERENCE TO RELATED APPLICATIONS

The present application claims priority under 35 U.S.C. § 119(a) to Korean Patent Application No. 10-2024-0036097, filed on Mar. 14, 2024, which application is incorporated herein by reference in its entirety.

BACKGROUND

1. Technical Field

The present disclosure relates to memory devices, including but not limited to a memory device detecting a failure of a through-silicon via.

2. Related Art

Recently, stack memory systems such as high bandwidth memory (HBM) have been used in a wide range of applications due to excellent bandwidth and energy efficiency. Unlike existing memory systems that use parallel data buses, the stack memory system includes a stack memory device composed of a base chip and a plurality of memory chips interconnected by through-silicon vias, TSV, also referred to as "through vias." When the base chip receives data output from the memory chip during a read operation and transmits the data to a controller, the base chip generates a data strobing signal generated based on a clock signal and transmits the data strobing signal to the memory chip, such that the data can be adjusted to be output from the memory chip based on the data strobing signal.

SUMMARY

In accordance with an embodiment of the present disclosure, a memory device may include a base die and a plurality of core dies stacked over the base die. The base die may include a first base scan control circuit connected to a first node connected to a first through via included in a first column and a second base scan control circuit connected to a second node connected to a second through via included in a second column. The first base scan control circuit may set the first node at a floating state when the first column is selected during a test mode and drive the first node when the second column is selected during the test mode.

In accordance with an embodiment of the present disclosure, a memory device may include a base die and a plurality of core dies stacked over the base die. The plurality of core dies may include a first core die and a second core die. In the present disclosure, the first core die is located furthest away from the base die among the plurality of core dies and may be configured to drive a first plurality of nodes during a first test mode and set the first plurality of nodes group at a floating state during a second test mode, wherein each of a first plurality of through vias is connected to a different one of the first plurality of nodes. The second core die may be configured to set a second plurality of nodes at a floating state during one of the first test mode and the second test mode, wherein each of a second plurality of through vias is connected to a different one of the second plurality of nodes.

In accordance with an embodiment of the present disclosure, a memory device may include a base die, a first core die stacked over the base die, and a second core die stacked over the first core die. In the present disclosure, the base die may include a first base scan control circuit connected to a first node connected to a first through via included in a first column, and a second base scan control circuit connected to a second node connected to a second through via included in a second column. In the present disclosure, the first base scan control circuit may set the first node at a floating state during a first test mode, set the first node at a floating state when the first column is selected during a second test mode, and drive the first node when the second column is selected during the second test mode.

In accordance with an embodiment of the present disclosure, a memory device may include a base die, a first die stacked over the base die and including a first plurality of nodes, and a second die stacked over the first die and including a second plurality of nodes including a first node and a second node. A first plurality of through vias may be connected in a first column, wherein the first plurality of through vias comprises a first through via within the base die, a second through via within the first die, and a third through via connected to a first node within the second die. A second plurality of through vias may be connected in a second column, wherein the second plurality of through vias comprises a fourth through via within the base die, a fifth through via within the first die, and a sixth through via connected to a second node within the second die. The second die may be configured to drive the first node during a first test mode, set the first node at a floating state when the first column is selected during a second test mode, and drive the first node when the second column is selected during the second test mode. The first die may be configured to set the first plurality of nodes at a floating state during one of the first test mode and the second test mode. The base die may be configured to select the first column and output a first current flowing through the first column as a scan current and to select the second column and output a second current flowing through the second column as the scan current, wherein the scan current identifies any through via failures among the first plurality of through vias and the second plurality of through vias.

BRIEF DESCRIPTION OF THE DRAWINGS

FIG. 9 illustrates a table identifying whether a failure occurs according to scan current during a first test mode according to an embodiment of the present disclosure.

FIG. 18 illustrates a table identifying whether a failure occurs according to scan current during a second test mode according to an embodiment of the present disclosure.

DETAILED DESCRIPTION

Terms such as "first," "second," "third," and so forth are used to distinguish between various elements and do not imply size, order, priority, quantity, or importance of the elements, and these elements are not limited by these terms. Thus, a first element in one embodiment may be referred to as a second element in another embodiment without departing from the teachings of the present disclosure.

When an element is referred to as "connected" to another element, the elements may be directly connected or connected with one or more intervening elements between the elements. When two elements are referred to as "directly connected," no intervening element is between the two elements. When one element is identified as "on" or "over" another element, the elements may directly contact each other or an intervening element may be disposed between the elements. Terms such as "top," "over," "on," "side," "level," "column," "outermost," and other terms implying relative spatial relationship or orientation are utilized only for the purpose of ease of description or reference to a drawing and are not otherwise limiting.

A logic "high" level and a logic "low" level may be used to describe logic levels of electric signals. A signal at a logic high level is distinguished from a signal at a logic low level. For example, when a signal at a first voltage corresponds to a signal at a logic high level, a signal at a second voltage corresponds to a signal at a logic low level. In an embodiment, the logic high level is at a voltage level that is higher than a voltage level of the logic low level. Logic levels of signals may be different or opposite according to an embodiment. For example, a signal at a logic high level in one embodiment may be at a logic low level in another embodiment. Unless indicated otherwise in the present disclosure, an activated signal is at a logic high level, and a deactivated signal is at a logic low level.

Various embodiments of the present disclosure are described in detail with reference to the accompanying drawings. The embodiments described are for illustrative purposes only and do not limit the scope of the present disclosure.

Figure 1:
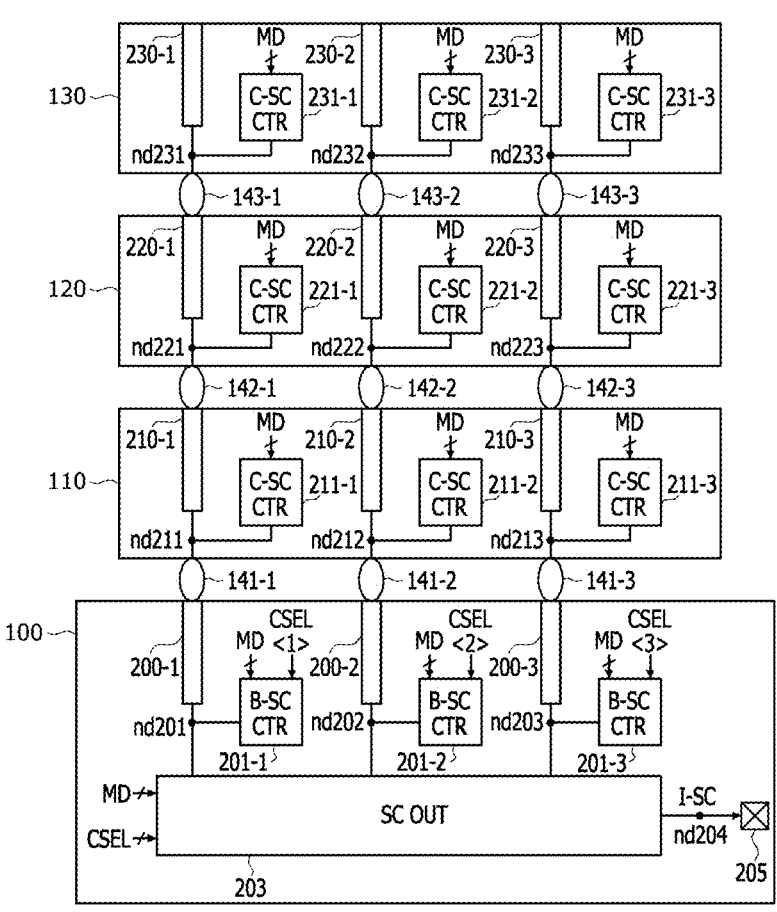
FIG. 1 illustrates a configuration of a memory device according to an embodiment of the present disclosure.

FIG. 1 illustrates a configuration of a memory device 10 according to an embodiment of the present disclosure. As shown in FIG. 1, the memory device 10 includes a base die 100, a first core die 110, a second core die 120, and a third core die 130.

The base die 100 includes through vias 200-1, 200-2, and 200-3, base scan control circuits 201-1, 201-2, and 201-3, a scan output circuit 203, and a test pad 205.

The through via 200-1 is disposed between a solder ball 141-1 and a node nd201 and is electrically connected to the solder ball 141-1 and the node nd201. The through via 200-1 is included in a first column. A column may include, for example, one or more through vias, one or more nodes, and one or more solder balls that are connected or electrically connected in series. A column is not necessarily vertically arranged. The through via 200-2 is disposed between a solder ball 141-2 and a node nd202 and is electrically connected to the solder ball 141-2 and the node nd202. The through via 200-2 is included in a second column. The through via 200-3 is disposed between a solder ball 141-3 and a node nd203 and is electrically connected to the solder ball 141-3 and the node nd203. The through via 200-3 is included in a third column.

The base scan control circuit 201-1 is connected to the node nd201. The base scan control circuit 201-1 drives the node nd201 or facilitates electric current flow through the node nd201 based on a mode signal MD and a first column selection signal CSEL<1>. The mode signal MD includes information such as whether to enter a first test mode or a second test mode. The first column selection signal CSEL<1> is activated to select the first column. The base scan control circuit 201-1 is included in the first column. The base scan control circuit 201-1 drives the node nd201 to a power supply voltage such as VDD in FIG. 2 during an up-scan operation and the electric current flows through the node nd201 during a down-scan operation. The base scan control circuit 201-1 sets the node nd201 at a floating state during the first test mode. The base scan control circuit 201-1 drives the node nd201 at the power supply voltage when the first column is not selected during the second test mode and sets the node nd201 at a floating state when the first column is selected.

The base scan control circuit 201-2 is connected to the node nd202. The base scan control circuit 201-2 drives the node nd202 or facilitates electric current flow through the node nd202 based on the mode signal MD and a second column selection signal CSEL<2>. The second column selection signal CSEL<2> is activated to select the second column. The base scan control circuit 201-2 is included in the second column. The base scan control circuit 201-2 drives the node nd202 to the power supply voltage during the up-scan operation and the electric current flows through the node nd202 during the down-scan operation. The base scan control circuit 201-2 sets the node nd202 at a floating state during the first test mode. The base scan control circuit 201-2 drives the node nd202 at the power supply voltage when the second column is not selected during the second test mode and sets the node nd202 at a floating state when the second column is selected.

The base scan control circuit 201-3 is connected to the node nd203. The base scan control circuit 201-3 drives the node nd203 or facilitates electric current flow through the node nd203 based on the mode signal MD and a third column selection signal CSEL<3>. The third column selection signal CSEL<3> is activated to select the third column. The base scan control circuit 201-3 is included in the third column. The base scan control circuit 201-3 drives the node nd203 to the power supply voltage during the up-scan operation and the electric current flows through the node nd203 during the down-scan operation. The base scan control circuit 201-3 sets the node nd203 at a floating state during the first test mode. The base scan control circuit 201-3 drives the node nd203 at the power supply voltage when the third column is not selected during the second test mode and sets the node nd203 at a floating state when the third column is selected.

The scan output circuit 203 is connected to the nodes nd201, nd202, and nd203 and outputs the current of one of the nodes nd201, nd202, and nd203 as a scan current I-SC at node nd204 through the test pad 205 based on the mode signal MD and the column selection signal CSEL. The column selection signal CSEL includes the first column selection signal CSEL<1>, the second column selection signal CSEL<2>, and the third column selection signal CSEL<3>. The scan output circuit 203 outputs the current of the node nd201 as the scan current I-SC through the test pad 205 when the first column is selected during the first test mode or the second test mode. The scan output circuit 203 outputs the current of the node nd202 as the scan current I-SC through the test pad 205 when the second column is selected during the first test mode or the second test mode. The scan output circuit 203 outputs the current of the node nd203 as the scan current I-SC through the test pad 205 when the third column is selected during the first test mode or the second test mode.

The first core die 110 is connected to the solder balls 141-1, 141-2, and 141-3 and is stacked over the base die 100. The first core die 110 includes through vias 210-1, 210-2, and 210-3 and core scan control circuits 211-1, 211-2, and 211-3.

The through via 210-1 is disposed between a solder ball 142-1 and a node nd211 and is electrically connected to the solder ball 142-1 and the node nd211. The through via 210-1 is included in the first column. The through via 210-2 is disposed between a solder ball 142-2 and a node nd212 and is electrically connected to the solder ball 142-2 and the node nd212. The through via 210-2 is included in the second column. The through via 210-3 is disposed between a solder ball 142-3 and a node nd213 and is electrically connected to the solder ball 142-3 and the node nd213. The though via 210-3 is included in the third column.

The core scan control circuit 211-1 is connected to the node nd211. The core scan control circuit 211-1 sets the node nd211 at a floating state based on the mode signal MD. The core scan control circuit 211-1 is included in the first column. The core scan control circuit 211-1 sets the node nd211 at a floating state during the up-scan operation. The core scan control circuit 211-1 sets the node nd211 at a floating state during the down-scan operation. The core scan control circuit 211-1 sets the node nd211 at a floating state during the first test mode. The core scan control circuit 211-1 sets the node nd211 at a floating state during the second test mode.

The core scan control circuit 211-2 is connected to the node nd212. The core scan control circuit 211-2 sets the node nd212 at a floating state based on the mode signal MD. The core scan control circuit 211-2 is included in the second column. The core scan control circuit 211-2 sets the node nd212 at a floating state during the up-scan operation. The core scan control circuit 211-2 sets the node nd212 at a floating state during the down-scan operation. The core scan control circuit 211-2 sets the node nd212 at a floating state during the first test mode. The core scan control circuit 211-2 sets the node nd212 at a floating state during the second test mode.

The core scan control circuit 211-3 is connected to the node nd213. The core scan control circuit 211-3 sets the node nd213 at a floating state based on the mode signal MD. The core scan control circuit 211-3 is included in the third column. The core scan control circuit 211-3 sets the node nd213 at a floating state during the up-scan operation. The core scan control circuit 211-3 sets the node nd213 at a floating state during the down-scan operation. The core scan control circuit 211-3 sets the node nd213 at a floating state during the first test mode. The core scan control circuit 211-3 sets the node nd213 at a floating state during the second test mode.

The second core die 120 is connected to the solder balls 142-1, 142-2, and 142-3 and is stacked over the first core die 110. The second core die 120 includes through vias 220-1, 220-2, and 220-3 and core scan control circuits 221-1, 221-2, and 221-3.

The through via 220-1 are disposed between a solder ball 143-1 and a node nd221 and is electrically connected to the solder ball 143-1 and the node nd221. The through via 220-1 is included in the first column. The through via 220-2 is disposed between a solder ball 143-2 and a node nd222 and is electrically connected to the solder ball 143-2 and the node nd222. The through via 220-2 is included in the second column. The through via 220-3 is disposed between a solder ball 143-3 and a node nd223 and is electrically connected to the solder ball 143-3 and the node nd223. The through via 220-3 is included in the third column.

The core scan control circuit 221-1 is connected to the node nd221. The core scan control circuit 221-1 sets the node nd221 at a floating state based on the mode signal MD. The core scan control circuit 221-1 is included in the first column. The core scan control circuit 221-1 sets the node nd221 at a floating state during the up-scan operation. The core scan control circuit 221-1 sets the node nd221 at a floating state during the down-scan operation. The core scan control circuit 221-1 sets the node nd221 at a floating state during the first test mode. The core scan control circuit 221-1 sets the node nd221 at a floating state during the second test mode.

The core scan control circuit 221-2 is connected to the node nd222. The core scan control circuit 221-2 sets the node nd222 at a floating state based on the mode signal MD. The core scan control circuit 221-2 is included in the second column. The core scan control circuit 221-2 sets the node nd222 at a floating state during the up-scan operation. The core scan control circuit 221-2 sets the node nd222 at a floating state during the down-scan operation. The core scan control circuit 221-2 sets the node nd222 at a floating state during the first test mode. The core scan control circuit 221-2 sets the node nd222 at a floating state during the second test mode.

The core scan control circuit 221-3 is connected to the node nd223. The core scan control circuit 221-3 sets the node nd223 at a floating state based on the mode signal MD. The core scan control circuit 221-3 is connected to the third column. The core scan control circuit 221-3 sets the node nd223 at a floating state during the up-scan operation. The core scan control circuit 221-3 sets the node nd223 at a floating state during the down-scan operation. The core scan control circuit 221-3 sets the node nd223 at a floating state during the first test mode. The core scan control circuit 221-3 sets the node nd223 at a floating state during the second test mode.

The third core die 130 is connected to the solder balls 143-1, 143-2, and 143-3 and is stacked over the second core die 120. The third core die 130 includes through vias 230-1, 230-2, and 230-3 and core scan control circuits 231-1, 231-2, and 231-3.

The through via 230-1 is electrically connected to a node nd231. The through via 230-1 is included in the first column. The through via 230-2 is electrically connected to a node nd232. The through via 230-2 is included in the second column. The through via 230-3 is electrically connected to a node nd233. The through via 230-3 is included in the third column.

The core scan control circuit 231-1 is connected to the node nd231. The core scan control circuit 231-1 drives the node nd231 or facilitates electric current flow through the node nd231 based on the mode signal MD. The core scan control circuit 231-1 facilitates the electric current flow through the node nd231 during the up-scan operation. The core scan control circuit 231-1 drives the node nd231 at the power supply voltage during the down-scan operation. The core scan control circuit 231-1 drives the node nd231 at the power supply voltage during the first test mode. The core scan control circuit 231-1 facilitates electric current flow through the node nd231 during the second test mode.

The core scan control circuit 231-2 is connected to the node nd232. The core scan control circuit 231-2 drives the node nd232 or facilitates the electric current flow through the node nd232 based on the mode signal MD. The core scan control circuit 231-2 facilitates electric current flow through the node nd232 during the up-scan operation. The core scan control circuit 231-2 drives the node nd232 at the power supply voltage during the down-scan operation. The core scan control circuit 231-2 drives the node nd232 at the power supply voltage during the first test mode. The core scan control circuit 231-2 facilitates electric current flow through the node nd232 during the second test mode.

The core scan control circuit 231-3 is connected to the node nd233. The core scan control circuit 231-3 drives the node nd233 or facilitates electric current flow through the node nd233 based on the mode signal MD. The core scan control circuit 231-3 facilitates electric current flow through the node nd233 during the up-scan operation. The core scan control circuit 231-3 drives the node nd233 at the power supply voltage during the down scan-operation. The core scan control circuit 231-3 drives the node nd233 at the power supply voltage during the first test mode. The core scan control circuit 231-3 facilitates electric current flow through the node nd233 during the second test mode.

For the convenience of explanation, the memory device 10 shown in FIG. 1 is described as an example in which three dies, for example, the first core die 110, the second core die 120, and the third core die 130 are stacked over the base die 100. Depending on the embodiment, the memory device 10 may be implemented by stacking four core dies, eight core dies, twelve core dies, or other quantities of core dies over the base die 100.

Figure 2:
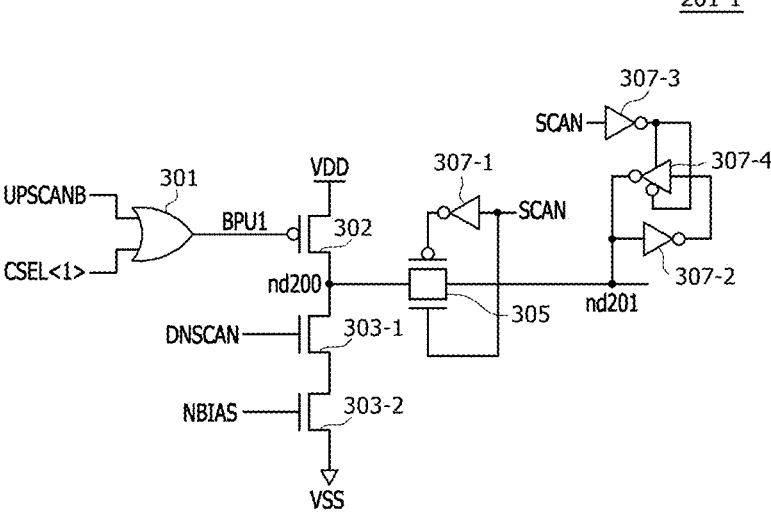
FIG. 2 illustrates a base scan control circuit included in a base die according to an embodiment of the present disclosure.

FIG. 2 illustrates a base scan control circuit 201-1, for example, as included in the base die shown in FIG. 1.

As shown in FIG. 2, the base scan control circuit 201-1 includes an OR device 301, a PMOS transistor 302, NMOS transistors 303-1 and 303-2, inverters 307-1, 307-2, 307-3, and 307-4, and a transmission gate 305. The OR device 301 receives an up-scan signal UPSCANB and the first column selection signal CSEL<1> and performs an OR operation to generate a base pull-up signal BPU1. The up-scan signal UPSCANB is activated during the up-scan operation and the second test mode and is deactivated during the down-scan operation and the first test mode. The OR device 301 generates the base pull-up signal BPU1 that is activated when the up-scan operation is performed without selection of the first column. The PMOS transistor 302 drives the node nd200 at the power supply voltage VDD when the base pull-up signal BPU1 is activated. The NMOS transistor 303-1 is turned on based on a down-scan signal DNSCAN, and the NMOS transistor 303-2 is turned on based on a bias voltage NBIAS. The down-scan signal DNSCAN is activated when the down-scan operation is performed, and the bias voltage NBIAS is at a voltage level that controls the rate at which the electric current at the node nd200 flows. The inverter 307-1 inversely buffers a scan signal SCAN. The scan signal SCAN is activated during the up-scan operation, the down-scan operation, the first test mode, and the second test mode. The transmission gate 305 transmits the signal at the node nd200 to the node nd201 when the scan signal SCAN is activated. The inverters 307-2, 307-3, and 307-4 latches the voltage of the node nd201 when the scan signal SCAN is deactivated.

The base scan control circuit 201-1 receives the up-scan signal UPSCANB that is activated during the up-scan operation and the first column selection signal CSEL<1> that is deactivated during the up-scan operation to generate the activated base pull-up signal BPU1. The PMOS transistor 302 is turned on by the activated base pull-up signal BPU1 and the node nd200 is driven at the power supply voltage VDD. The voltage of the node nd200 driven at the power supply voltage VDD is output to the node nd201 through the turned-on transmission gate 305. In the base scan control circuit 201-1, the NMOS transistor 303-1 is turned on by the down-scan signal DNSCAN activated during the down-scan operation, such that the electric current at the node nd200 flows. The voltage at the node nd200 from which the electric current flows is output to the node nd201 through the turned-on transmission gate 305. The base scan control circuit 201-1 sets the node nd200 at a floating state by the up-scan signal UPSCANB and the down-scan signal DNSCAN, which are both deactivated during the first test mode and outputs the voltage of the node nd200 at a floating state to the node nd201 through the turned-on transmission gate 305. The base scan control circuit 201-1 receives the first column selection signal CSEL<1> that is activated to select the first column while the activated up-scan signal UPSCANB and the deactivated down-scan signal DNSCAN are received during the second test mode to generate the deactivated base pull-up signal BPU1. The PMOS transistor 302 is turned off by the deactivated base pull-up signal BPU1 and the node nd200 is at a floating state. The voltage of the node nd200 at a floating state is output to the node nd201 through the turned-on transmission gate 305. The base scan control circuit 201-1 receives the deactivated first column selection signal CSEL<1> when the first column is not selected while the activated up-scan signal UPSCANB and the deactivated down-scan signal DNSCAN are received during the second test mode to generate the activated base pull-up signal BPU1. The PMOS transistor 302 is turned on by the activated base pull-up signal BPU1, and the node nd200 is driven at the power supply voltage VDD. The voltage of the node nd200 driven by the power supply voltage VDD is output to the node nd201 through the turned-on transmission gate 305.

Figure 3:
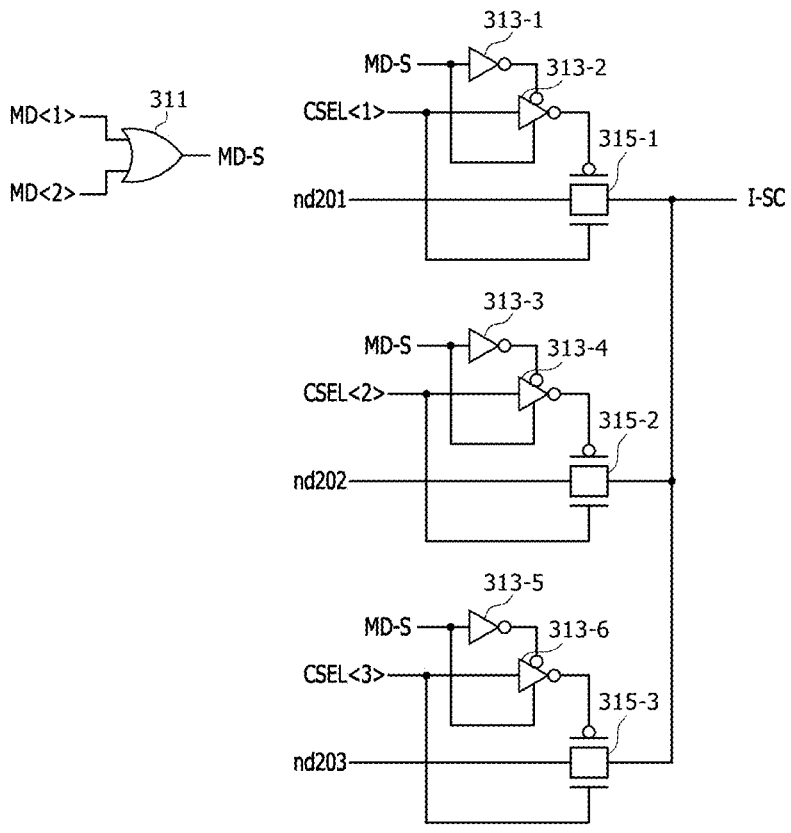
FIG. 3 illustrates a scan output circuit included in a base die according to an embodiment of the present disclosure.

FIG. 3 illustrates a scan output circuit 203, for example, as included in the base die shown in FIG. 1.

As shown in FIG. 3, the scan output circuit 203 includes an OR device 311, inverters 313-1 through 313-6, and transmission gates 315-1 through 315-3.

The OR device 311 generates a synthesis mode signal MD-S based on a first mode signal MD<1> and a second mode signal MD<2>. The first mode signal MD<1> is activated during the first test mode, and the second mode signal MD<2> is activated during the second test mode. The OR device 311 receives the first mode signal MD<1> and the second mode signal MD<2> and performs an OR operation to generate the synthesis mode signal MD-S. The OR device 311 generates the synthesis mode signal MD-S that is activated when the first test mode or the second test mode is performed.

The transmission gate 315-1 is turned on when the first column is selected and the first column selection signal CSEL<1> is activated while the first test mode or the second test mode is performed to output the current at the node nd201 as the scan current I-SC.

The transmission gate 315-2 is turned on when the second column is selected and the second column selection signal CSEL<2> is activated while the first test mode or the second test mode is performed to output the current at the node nd202 as the scan current I-SC.

The transmission gate 315-3 is turned on when the third column is selected and the third column selection signal CSEL<3> is activated while the first test mode or the second test mode is performed to output the current at the node nd203 as the scan current I-SC.

Figure 4:
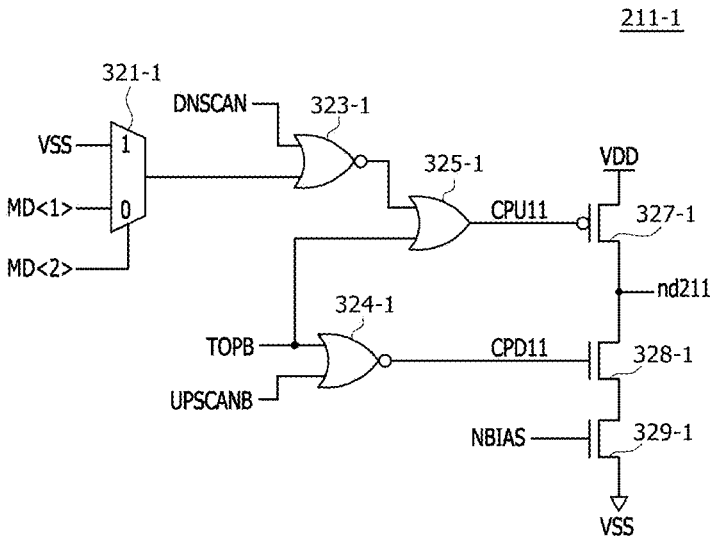
FIG. 4 illustrates a core scan control circuit according to an embodiment of the present disclosure.

FIG. 4 illustrates a core scan control circuit 211-1, for example, as included in the first core die shown in FIG. 1.

As shown in FIG. 4, the core scan control circuit 211-1 includes a selector 321-1, NOR devices 323-1 and 324-1, an OR device 325-1, a PMOS transistor 327-1, and NMOS transistors 328-1 and 329-1. The selector 321-1 outputs the first test mode signal MD<1> during the first test mode and outputs a signal at a logic low level in one operation of the up-scan operation, the down-scan operation, and the second test mode. The NOR device 323-1 receives the down-scan signal DNSCAN and an output signal from the selector 321-1 to perform a NOR operation. The NOR device 324-1 receives a top core signal TOPB and the up-scan signal UPSCANB and performs a NOR operation to generate a core pull-down signal CPD11. The top core signal TOPB is activated when the core scan control circuit is located in a top or outermost layer of the memory device 10, such as the core die 130 in the example of FIG. 1, which is furthest from the base die 100. The top core signal TOPB is deactivated in the core scan control circuit 211-1 because the core scan control circuit 211-1 is not located in the top or outermost layer of the memory device 10. The OR device 325-1 receives an output signal from the NOR device 323-1 and the top core signal TOPB and performs an OR operation to generate a core pull-up signal CPU11. The PMOS transistor 327-1 is turned on based on the core pull-up signal CPU11 to drive the node nd211 to the power supply voltage VDD. The NMOS transistor 328-1 is turned on based on the core pull-down signal CPD11. The NMOS transistor 329-1 is turned on based on the bias voltage NBIAS.

The core scan control circuit 211-1 sets the node nd211 at a floating state according to the up-scan signal UPSCANB that is activated when the up-scan operation is performed and the top core signal TOPB that is deactivated when the up-scan operation is performed. The core scan control circuit 211-1 sets the node nd211 at a floating state according to the down-scan signal DNSCAN that is activated when the down-scan operation is performed. The core scan control circuit 211-1 sets the node nd211 at a floating state during the first test mode. The core scan control circuit 211-1 sets the node nd211 at a floating state during the second test mode.

Figure 5:
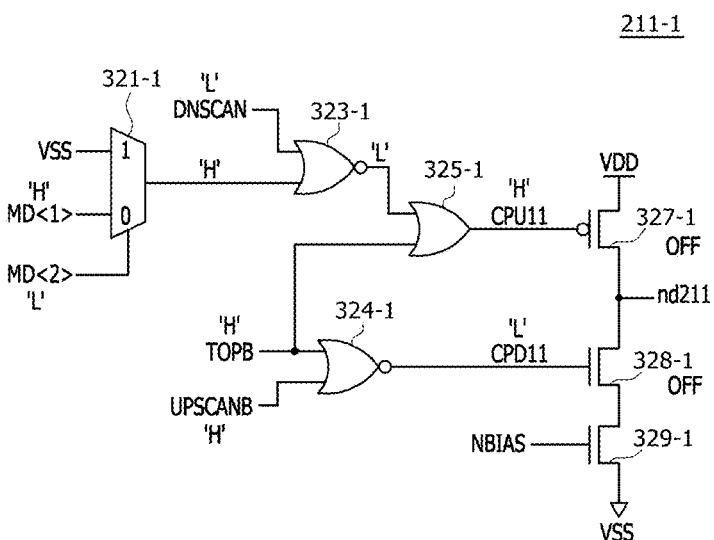
FIG. 5 and FIG. 6 illustrate a core scan control circuit during a first test mode according to an embodiment of the present disclosure.
Figure 6:
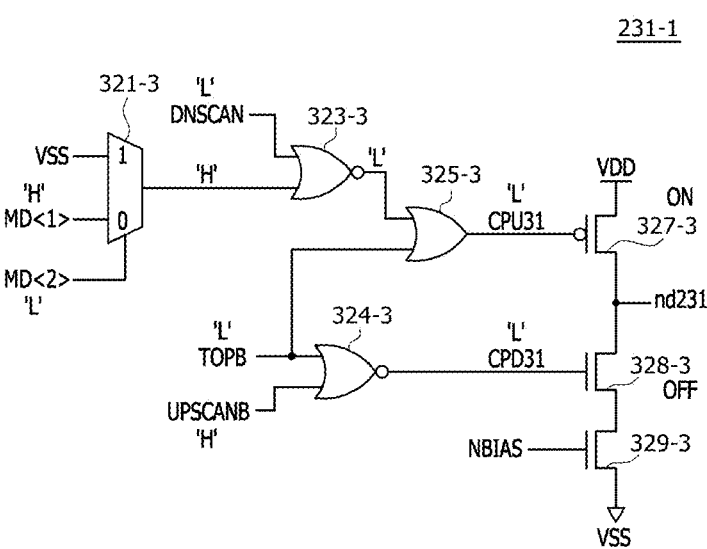

FIG. 5 and FIG. 6 illustrate core scan control circuits 211-1 (or 221-1) and 231-1, for example, as included in the core dies shown in FIG. 1, during the first test mode.

As shown in the core scan control circuit 211-1 of FIG. 5, during the first test mode, when the first mode signal MD<1> is activated at a logic high level 'H', the second mode signal MD<2> is deactivated at a logic low level 'L', the up-scan signal UPSCANB is deactivated at a logic high level 'H', the down scan signal DNSCAN is deactivated at a logic low level 'L', and the top core signal TOPB is deactivated at a logic high level 'H', both the PMOS transistor 327-1 and the NMOS transistor 328-1 are turned off by the core pull-up signal CPU11 that is deactivated at a logic high level 'H' and the core pull-down signal CPD11 that is deactivated at a logic low level 'L'. Accordingly, the core scan control circuit 211-1 included in the core die 110 that is not the top core sets the node nd211 at a floating state. The core scan control circuit 221-1 may be implemented with a similar circuit as the core scan control circuit 211-1 and may operate in a similar manner, such that the core scan control circuit 221-1 sets a node nd221 (not shown but corresponding to nd211 of FIG. 4) at a floating state.

FIG. 6 illustrates a core scan control circuit 231-1. As shown in FIG. 6, the core scan control circuit 231-1 includes a selector 321-3, NOR devices 323-3 and 324-3, an OR device 325-3, a PMOS transistor 327-3, and NMOS transistors 328-3 and 329-3. The core scan control circuit 231-1 may be implemented in a similar manner as the core scan control circuit 211-1 shown in FIG. 4.

As shown in FIG. 6, during the first test mode, when the first mode signal MD<1> is activated at a logic high level 'H', the second mode signal MD<2> is deactivated at a logic low level 'L', the up-scan signal UPSCANB is deactivated at a logic high level 'H', the down-scan signal DNSCAN is deactivated at a logic low level 'L', and the top core signal TOPB is activated at a logic low level 'L', the PMOS transistor 327-3 is turned on and the NMOS transistor 328-3 is turned off by the core pull-up signal CPU31 that is activated at a logic low level 'L' and the core pull-down signal CPD31 that is deactivated at a logic low level 'L'. Accordingly, the core scan control circuit 231-1 included in the core die 130, which is the top core, drives the node nd231 at the power supply voltage VDD.

Figure 7:
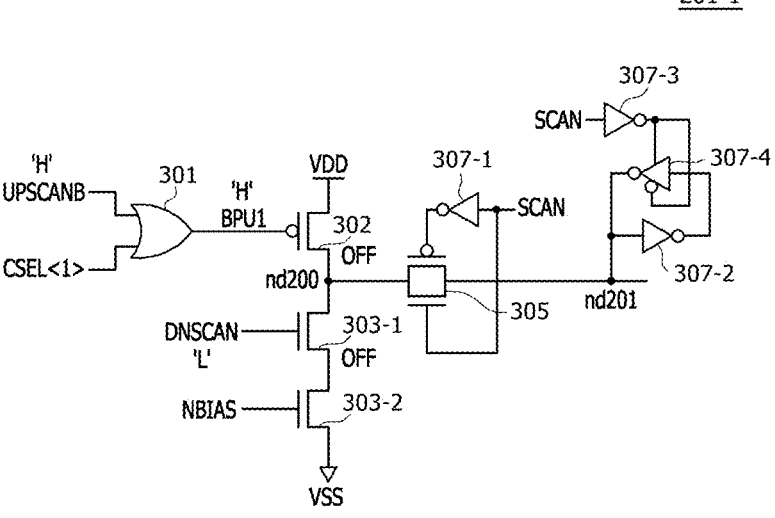
FIG. 7 illustrates a base scan control circuit during a first test mode according to an embodiment of the present disclosure.

FIG. 7 illustrates a base scan control circuit 201-1, for example, as shown in FIG. 2, during the first test mode.

As shown in FIG. 7, during the first test mode, when the up-scan signal UPSCANB is deactivated at a logic high level 'H' and the down-scan signal DNSCAN is deactivated at a logic low level 'L', both the POS transistor 302 and the NMOS transistor 303-1 are turned off. Accordingly, the base scan control circuit 201-1 sets both the node nd200 and the node nd201 at a floating state.

Figure 8:
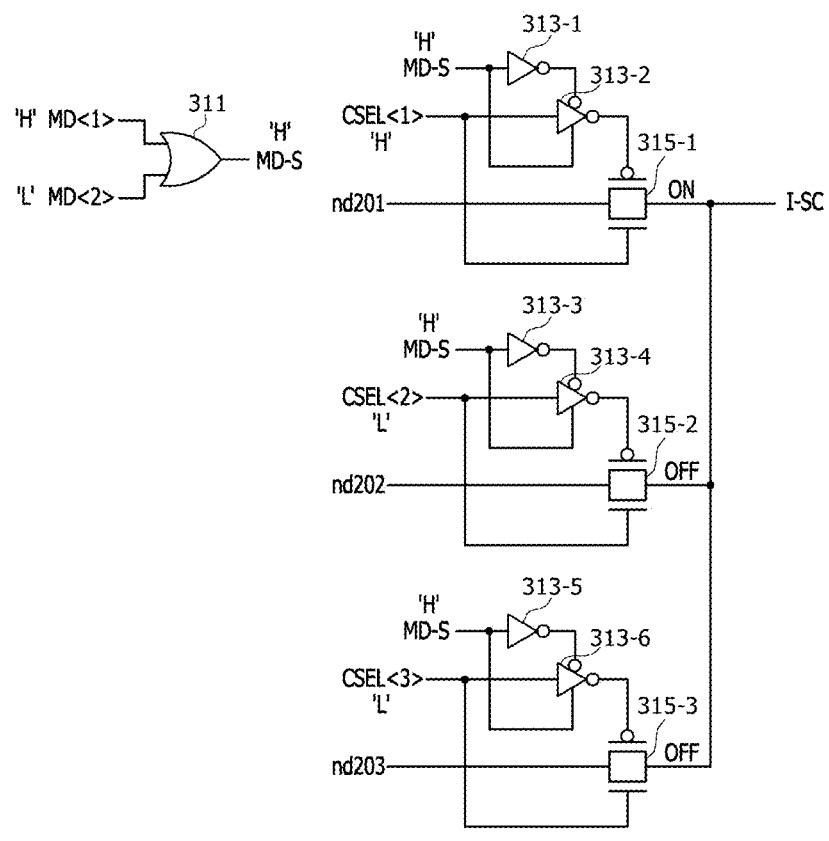
FIG. 8 illustrates a scan output circuit during a first test mode according to an embodiment of the present disclosure.

FIG. 8 illustrates a scan output circuit 203, for example, as shown in FIG. 3 during the first test mode.

As shown in FIG. 8, during the first test mode, the first mode signal MD<1> is activated at a logic high level 'H' and the second mode signal MD<2> is deactivated at a logic low level 'L', such that the synthesis mode signal MD_S is activated at a logic high level 'H'. When the first column selection signal CSEL<1> is activated at a logic high level 'H' and both the second column selection signal CSEL<2> and third column selection signal CSEL<3> are deactivated at a logic low level 'L', the scan output circuit 203 outputs the current at the node nd201 as the scan current I-SC.

Figure 10:
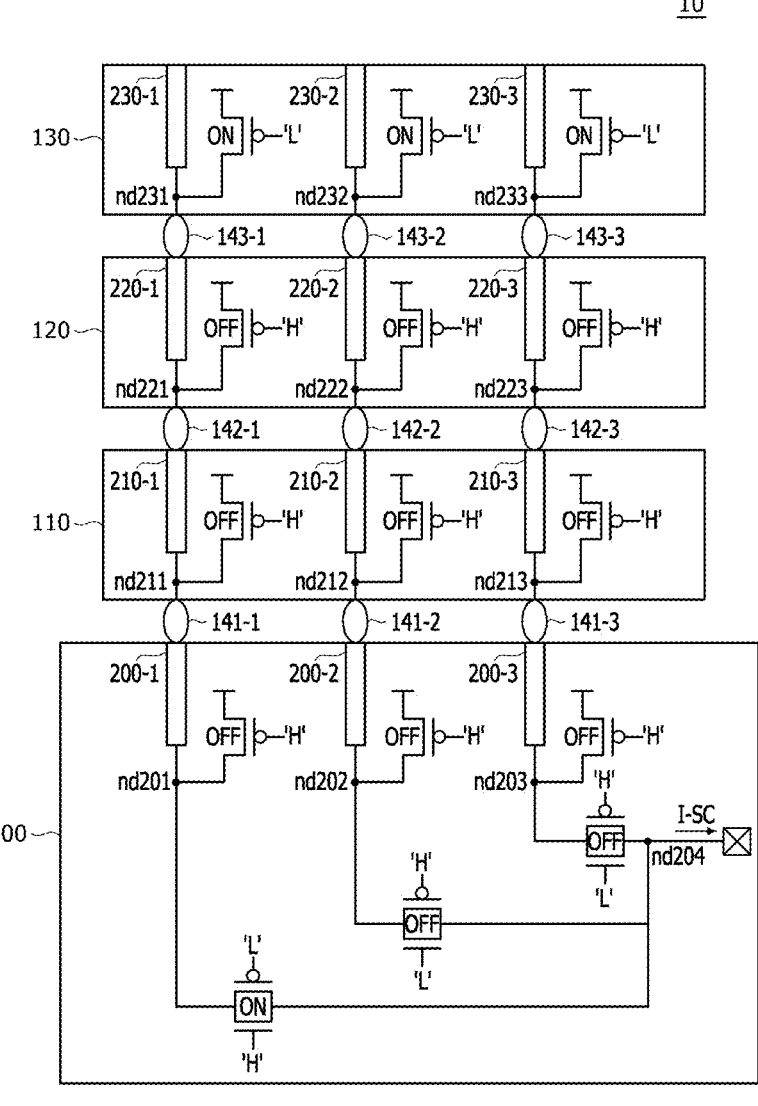
FIG. 10 illustrates a configuration of a memory device when no failure occurs in a through via during a first test mode according to an embodiment of the present disclosure.
Figure 11:
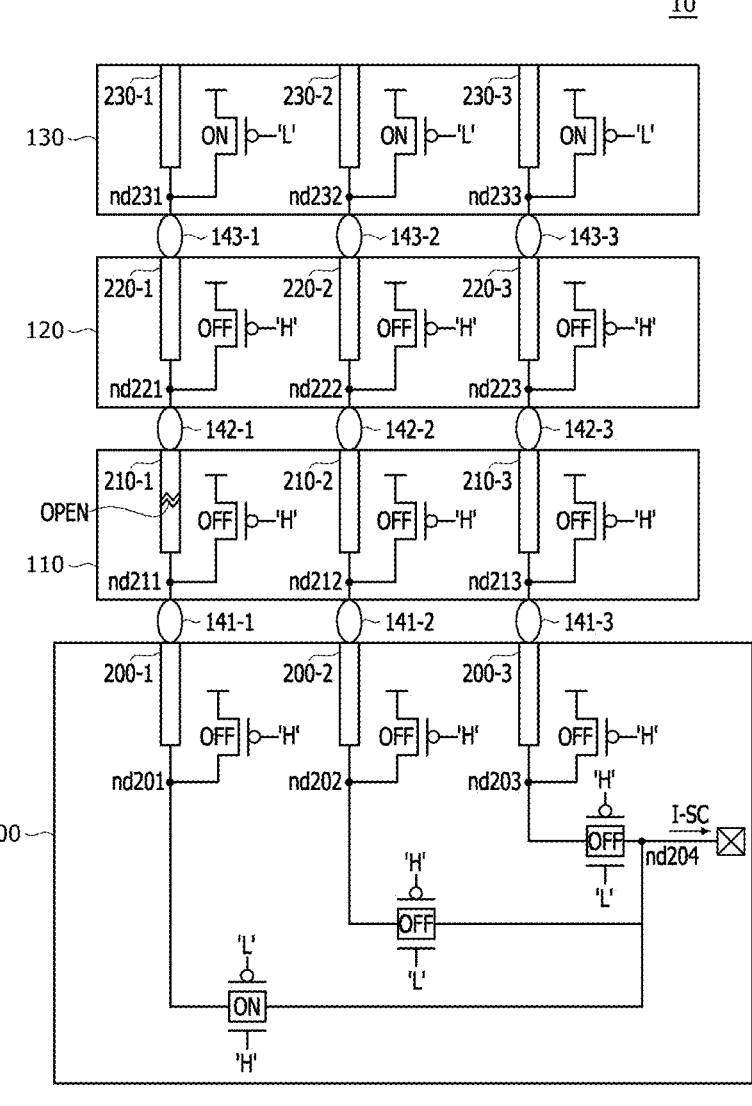
FIG. 11 illustrates a configuration of a memory device when an open circuit occurs in a through via during a first test mode according to an embodiment of the present disclosure.
Figure 12:
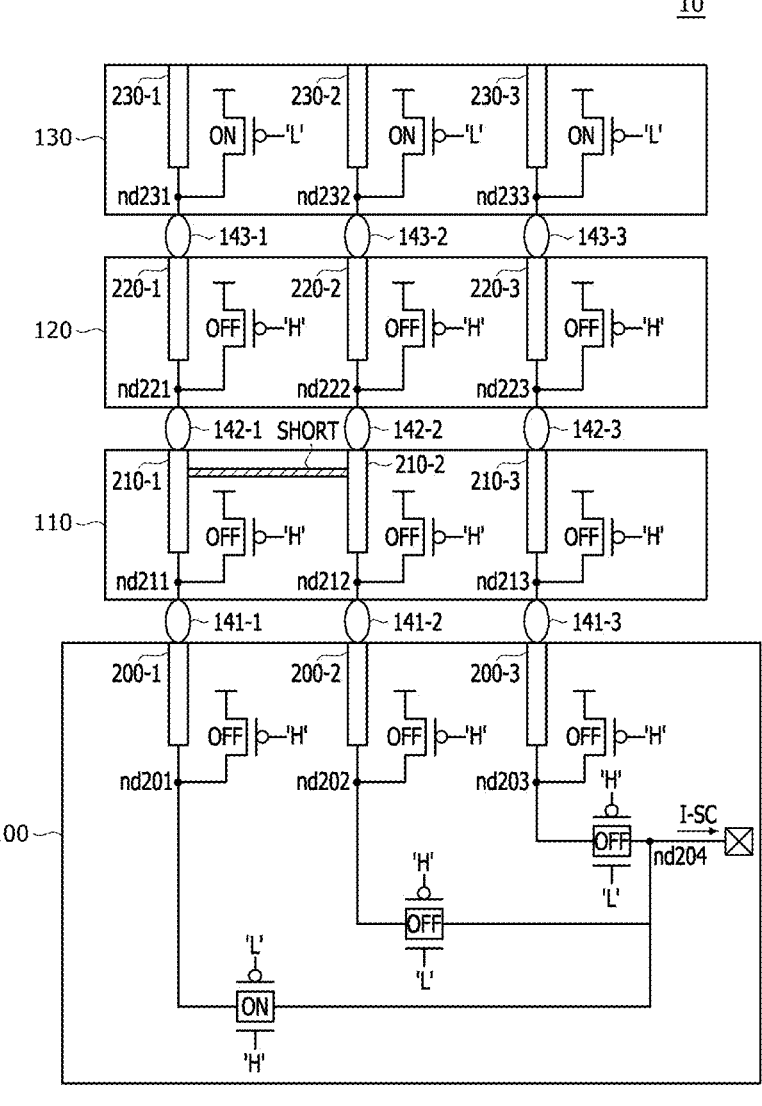
FIG. 12 illustrates a configuration of a memory device when a short circuit occurs in a through via during a first test mode according to an embodiment of the present disclosure.

FIG. 9 illustrates a table identifying whether a failure occurs according to scan current during the first test mode. FIG. 10 illustrates a configuration of a memory device 10 when no failure occurs in a through via during the first test mode. FIG. 11 illustrates a configuration of a memory device 10 when an open circuit failure occurs in a through via during the first test mode. FIG. 12 illustrates a configuration of a memory device 10 when a short circuit failure occurs in a through via during the first test mode. With reference to FIG. 9 to FIG. 12, the operation of identifying whether a failure occurred according to the scan current I-SC during the first test mode is described.

As shown in FIG. 9 to FIG. 12, during the first test mode, in the core die 130, all the PMOS transistors connected to the nodes nd231, nd232, and nd233, to which the through vias 230-1, 230-2, and 230-3 are respectively connected, are turned on, and the nodes nd231, nd232, and nd233 are driven at the power supply voltage. During the first test mode, in the core dies 120 and 110, all the PMOS transistors connected to the nodes nd221, nd222, nd223, nd211, nd212, and nd213, to which the through vias 220-1, 220-2, 220-3, 210-1, 210-2, and 210-3 are respectively connected, are turned off. During the first test mode, in the base die 100, all the PMOS transistors connected to the nodes nd201, nd202, and nd203, to which the through vias 200-1, 200-2, and 200-3 are respectively connected, are turned off and the first column is selected, such that only the transmission gate connected to the node nd201 is turned on.

As shown in FIG. 9 and FIG. 10, when open circuits or short circuits do not occur in the through vias 230-1, 230-2, 230-3, 220-1, 220-2, 220-3, 210-1, 210-2, 210-3, 200-1, 200-2, and 200-3, the scan current I-SC is at a target current IREF at the node nd201 connected to the node nd231 driven at the power supply voltage VDD through the through vias 220-1, 210-1, and 200-1.

As shown in FIG. 9 and FIG. 11, when an open circuit occurs in the through via 210-1, the scan current I-SC smaller than the target current IREF at the node nd231 driven at the power supply voltage VDD and the node nd201 connected through the through vias 220-1, 210-1, and 200-1 because the through via 210-1 is an open circuit and the current from the node nd231 is not properly or fully transmitted to the node nd201.

As shown in FIG. 9 and FIG. 12, when a short circuit occurs between the through via 210-1 and the through via 210-2, the electric current flowing through the node nd231 driven by the power supply voltage VDD flows through the node nd201 connected through the through vias 220-1, 210-1, and 200-1, but also the electric current flowing through the node nd232 driven by the power supply voltage VDD flows through the node nd201 through the through vias 220-2 and 210-2. As a result, the scan current I-SC at node nd204 is greater than the target current IREF.

Figure 13:
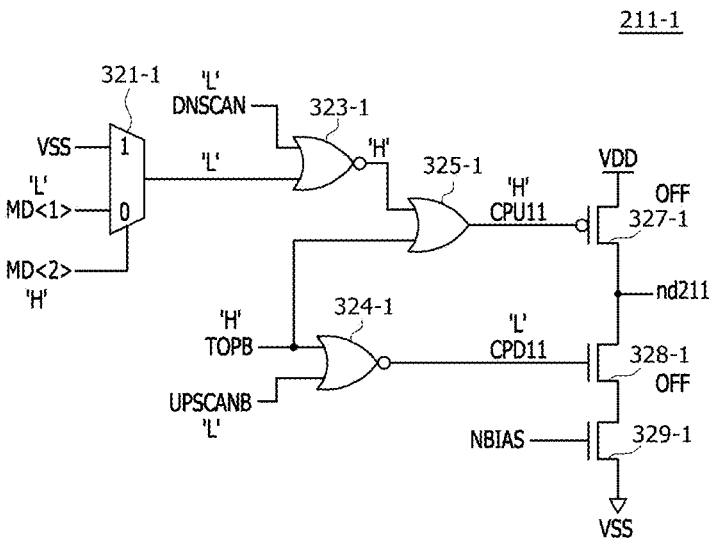
FIG. 13 and FIG. 14 illustrate a core scan circuit during a second test mode according to an embodiment of the present disclosure.
Figure 14:
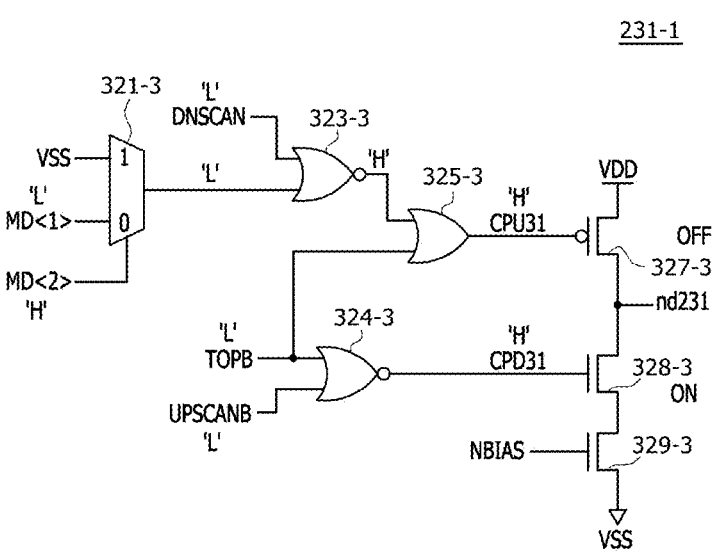

FIG. 13 and FIG. 14 illustrate core scan circuits 211-1 (or 221-1) and 231-1 during the second test mode.

As shown in FIG. 13, during the second test mode, when the first mode signal MD<1> is deactivated at a logic low level 'L', the second mode signal MD<2> is activated at a logic high level 'H', the up-scan signal UPSCANB is activated at a logic low level 'L', the down-scan signal DNSCAN is deactivated at a logic low level 'L', and the top core signal TOPB is deactivated at a logic high level 'H', both the PMOS transistor 327-1 and the NMOS transistor 328-1 are turned off by the core pull-up signal CPU11 that is deactivated at a logic high level 'H' and the core pull-down signal CPD11 that is deactivated at a logic low level 'L'. Accordingly, the core scan control circuit 211-1 included in the core die 110 other than the top core sets the node nd211 at a floating state. The core scan control circuit 221-1 may be implemented with a similar circuit as the core scan control circuit 211-1 and operate in a similar manner, such that the core scan control circuit 221-1 sets the node nd221 at a floating state.

As shown in FIG. 14, during the second test mode, when the first mode signal MD<1> is deactivated at a logic low level 'L', the second mode signal MD<2> is activated at a logic high level 'H', the up-scan signal UPSCANB is activated at a logic low level 'L', the down-scan signal DNSCAN is deactivated at a logic low level 'L', and the top core signal TOPB is activated at a logic low level 'L', the PMOS transistor 327-3 is turned off and the NMOS transistor 328-3 is turned on by the core pull-up signal CPU31 that is deactivated at a logic high level 'H' and the core pull-down signal CPD31 that is activated at a logic high level 'H'. Accordingly, the core scan control circuit 231-1 included in the core die 130, which is the top core, facilitates electric current flow through the node nd231.

Figure 15:
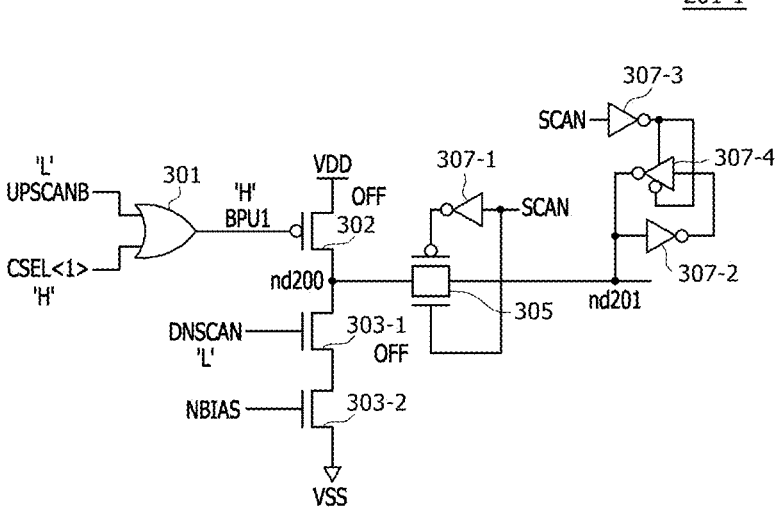
FIG. 15 and FIG. 16 illustrate a base scan control circuit during a second test mode according to an embodiment of the present disclosure.
Figure 16:
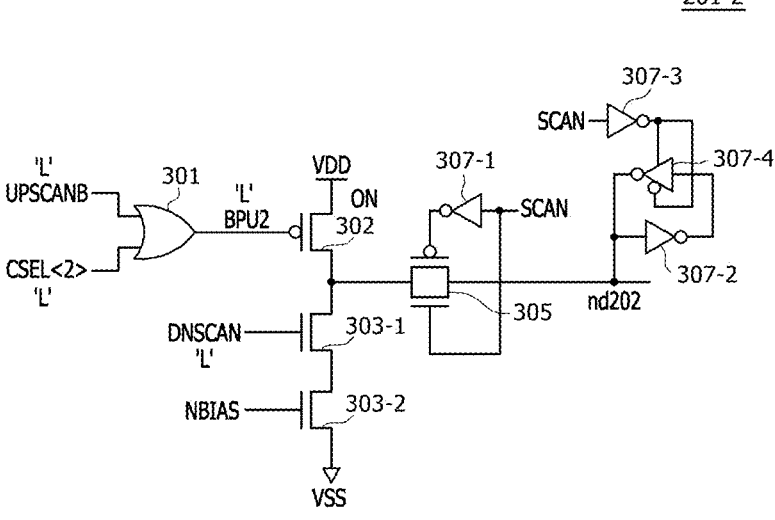

FIGS. 15 and 16 illustrate base scan control circuits 201-1 and 201-2, for example, as included in the base die shown in FIG. 1, during the second test mode.

As shown in FIG. 15, during the second test mode, when the up-scan signal UPSCANB is activated at a logic low level 'L', the down-scan signal DNSCAN is deactivated at a logic low level 'L', and the first column selection signal CSEL<1> is activated at a logic high level 'H', both the PMOS transistor 302 and the NMOS transistor 303-1 are turned off. Accordingly, the base scan control circuit 201-1 sets each of the node nd200 and the node nd201 at a floating state.

As shown in FIG. 16, during the second test mode, when the up-scan signal UPSCANB is activated at a logic low level 'L', the down-scan signal DNSCAN is deactivated at a logic low level 'L', and the second column selection signal CSEL<2> is deactivated at a logic low level 'L', the PMOS transistor 302 is turned on. Accordingly, the base scan control circuit 201-2 drives the node nd202 at the power supply voltage VDD.

Figure 17:
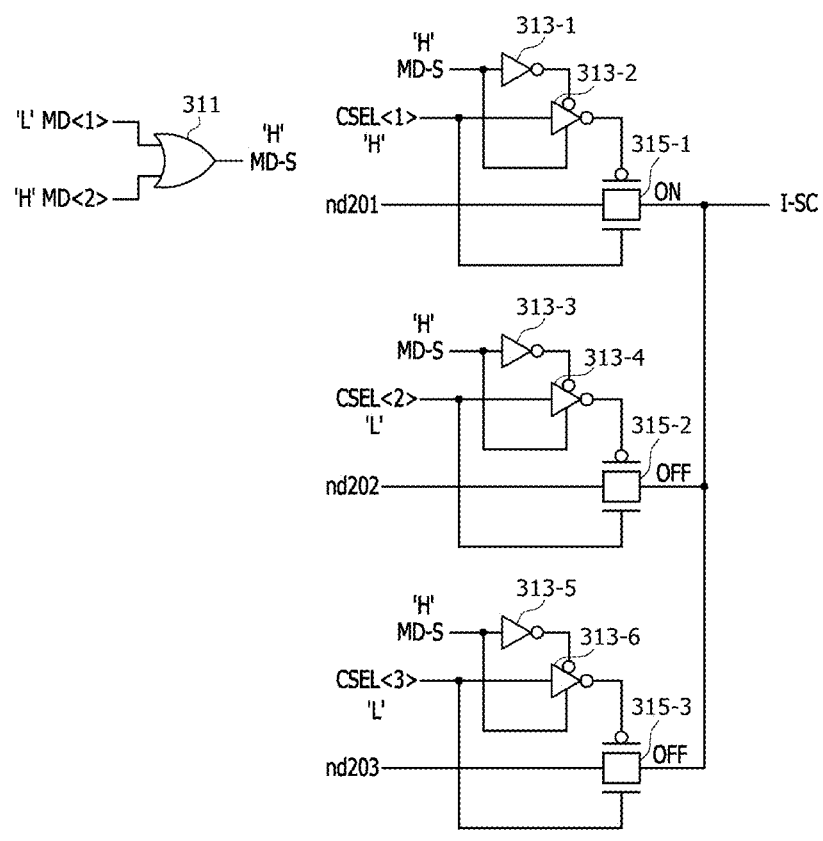
FIG. 17 illustrates a scan output circuit during a second test mode according to an embodiment of the present disclosure.

FIG. 17 illustrates a scan output circuit 203, for example, as shown in FIG. 3, during the second test mode.

As shown in FIG. 17, during the second test mode, the first mode signal MD<1> is deactivated at a logic low level 'L' and the second mode signal MD<2> is activated at a logic high level 'H', such that the synthesis mode signal MD_S is activated at a logic high level 'H'. When the first column selection signal CSEL<1> is activated at a logic high level 'H' and both the second column selection signal CSEL<2> and the third column selection signal CSEL<3> are deactivated at a logic low level 'L', the scan output circuit 203 outputs the current at the node nd201 as the scan current I-SC.

Figure 19:
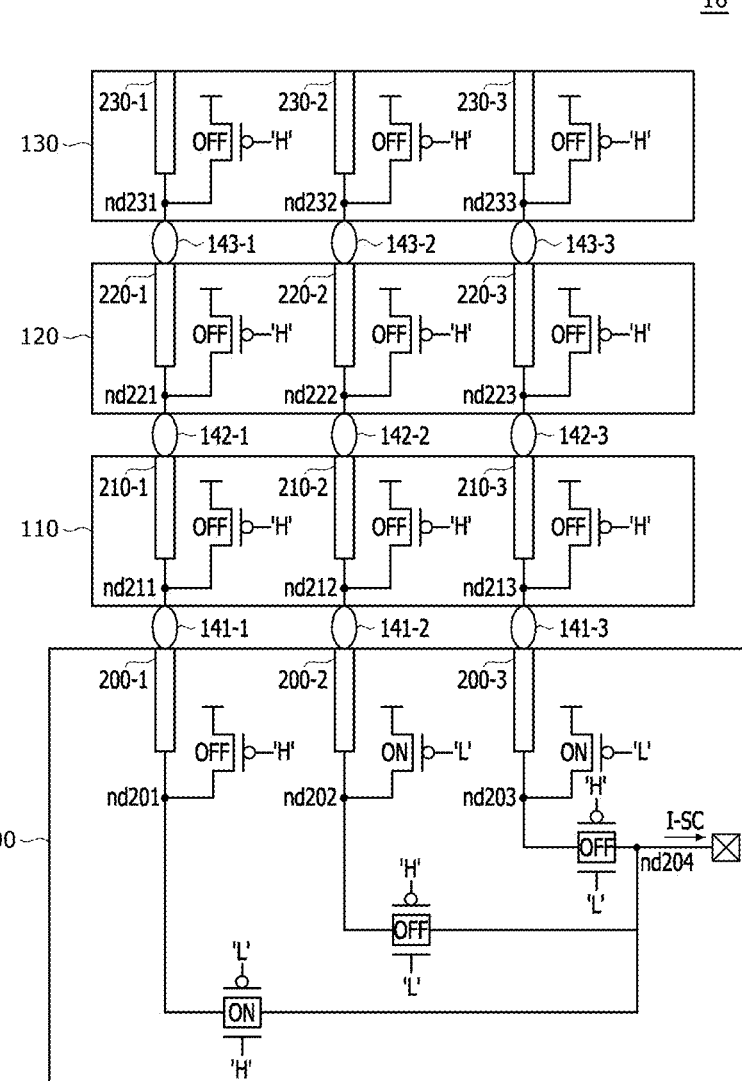
FIG. 19 illustrates a configuration of a memory device when no failure occurs in a through via during a second test mode according to an embodiment of the present disclosure.
Figure 20:
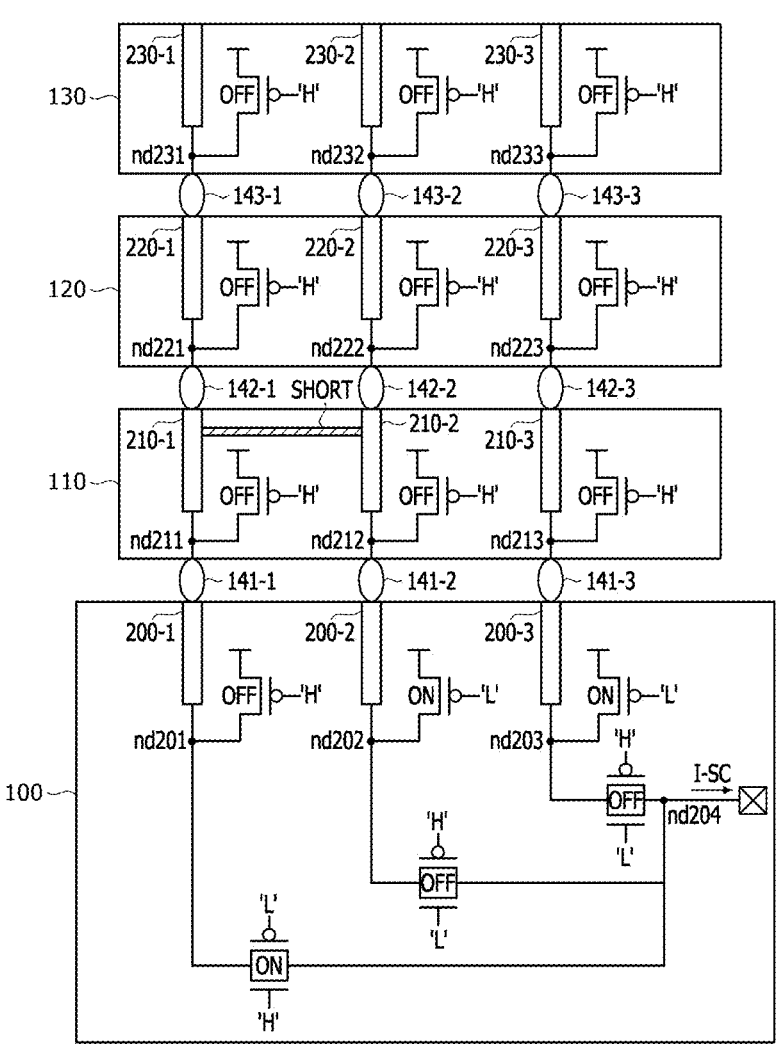
FIG. 20 illustrates a configuration of a memory device when a short circuit occurs in a through via during a second test mode according to an embodiment of the present disclosure.

FIG. 18 illustrates a table identifying whether a failure occurs according to the scan current I-SC, during the second test mode. FIG. 19 illustrates a configuration of a memory device when no failure occurs in the through vias during the second test mode. FIG. 20 illustrates a configuration of a memory device when a short circuit occurs in the through vias during the second test mode. With reference to FIG. 18 to FIG. 20, the operation of identifying whether a failure occurred according to the scan current I-SC during the second test mode is described.

As shown in FIG. 18 to FIG. 20, during the second test mode, in the core dies 130, 120, and 110, all the PMOS transistors connected to the nodes nd231, nd232, nd233, nd221, nd222, nd223, d211, nd212, and nd213 to which the through vias 230-1, 230-2, 230-3, 220-1, 220-2, 220-3, 210-1, 210-2, and 210-3 are respectively connected are turned off. During the second test mode, in the base die 100, the PMOS transistor connected to the node nd201 to which the through via 200-1 is connected is turned off, all the PMOS transistors connected to the nodes nd202 and nd203 to which the through vias 200-2 and 200-3 are respectively connected are turned on, and the first column is selected, such that only the transmission gate connected to the node nd201 is turned on.

As shown in FIG. 18 and FIG. 19, when no open circuit or short circuit occurs in the through vias 230-1, 230-2, 230-3, 220-1, 220-2, 220-3, 210-1, 210-2, 210-3, 200-1, 200-2, and 200-3, the scan current I-SC at node nd204 is at 0 A in accordance with the current at the node nd201 connected to the nodes nd231, nd221, and nd211 that are at a floating state through the through vias 220-1, 210-1, and 200-1.

As shown in FIG. 18 and FIG. 20, when a short circuit occurs between the through via 210-1 and the through via 210-2, the electric current flowing through the node nd202 driven at the power supply voltage VDD also flows through the node nd201 connected through the through vias 200-2, 210-2, 210-1, and 200-1. As a result, the scan current I-SC at node nd204 is greater than 0 A.

Although the detailed embodiments of the present disclosure are described in the present disclosure, those skilled in the art will understand that various modifications, additions, and substitutions are possible, without departing from the scope, concepts, and spirit of the present disclosure. Accordingly, the embodiments disclosed in the present specification should be considered not from a restrictive standpoint but rather from an illustrative standpoint. Therefore, the scope of the present disclosure should not be limited to the foregoing embodiments. All changes within the meaning and range of equivalency of the claims are included within their scope.

What is claimed is:

1. A memory device comprising:
a base die; and
a plurality of core dies stacked over the base die;
wherein the base die comprises:
a first base scan control circuit connected to a first node connected to a first through via included in a first column; and
a second base scan control circuit connected to a second node connected to a second through via included in a second column, and
wherein the first base scan control circuit is configured to:
set the first node at a floating state when the first column is selected during a test mode; and
drive the first node when the second column is selected during the test mode.

2. The memory device of claim 1, wherein the second base scan control circuit is configured to:
drive the second node when the first column is selected during the test mode; and
set the second node at a floating state when the second column is selected during the test mode.

3. The memory device of claim 1, wherein each of the plurality of core dies comprises:
a first core scan control circuit connected to a third node connected to a third through via included in the first column; and a second core scan control circuit connected to a fourth node connected to a fourth through via included in the second column.

4. The memory device of claim 3,
wherein the first through via is electrically connected to the third through via; and
wherein the second through via is electrically connected to the fourth through via.

5. The memory device of claim 3, wherein the first core scan control circuit is configured to set the third node at a floating state during the test mode.

6. The memory device of claim 3, wherein the second core scan control circuit is configured to set the fourth node at a floating state during the test mode.

7. The memory device of claim 1, further comprising a scan output circuit configured to:
output a current of the first node as a scan current when the first column is selected during the test mode; and
output a current of the second node as the scan current when the second column is selected during the test mode.

8. A memory device comprising:
a base die; and
a plurality of core dies stacked over the base die, wherein the plurality of core dies comprises a first core die and a second core die;
wherein the first core die is located furthest away from the base die among the plurality of core dies and is configured to drive a first plurality of nodes during a first test mode and set the first plurality of nodes at a floating state during a second test mode, wherein each of a first plurality of through vias is connected to a different one of the first plurality of nodes; and
wherein the second core die is configured to set a second plurality of nodes at a floating state during one of the first test mode and the second test mode, wherein each of a second plurality of through vias is connected to a different one of the second plurality of nodes.

9. The memory device of claim 8, wherein the base die sets a third plurality of nodes at a floating state, wherein each of a third plurality of through vias is connected to a different one of the third plurality of nodes.

10. The memory device of claim 9, wherein the base die is configured to:
drive nodes connected to a plurality of unselected columns among the third plurality of nodes during the second test mode; and
set the node connected to a selected column among the third plurality of nodes at a floating state during the second test mode.

11. The memory device of claim 9, further comprising a scan output circuit configured to output a current of a node connected to the first column among the third plurality of nodes as a scan current when the first column is selected during one of the first test mode and the second test mode.

12. The memory device of claim 8, further comprising a third core die disposed between the first core die and the base die, wherein the third core die sets a fourth plurality of nodes at a floating state during one of the first test mode and the second test mode, wherein each of a fourth plurality of through vias is connected to a different one of the fourth plurality of nodes.

13. A memory device comprising:
a base die;
a first core die stacked over the base die; and
a second core die stacked over the first core die;

wherein the base die comprises:

a first base scan control circuit connected to a first node connected to a first through via included in a first column; and a second base scan control circuit connected to a second node connected to a second through via included in a second column, and wherein the first base scan control circuit is configured to:

set the first node at a floating state during a first test mode, and set the first node at a floating state when the first column is selected during a second test mode and drive the first node when the second column is selected during the second test mode.

14. The memory device of claim 13, wherein the first base scan control circuit is configured to:

drive the first node based on a base pull-up signal that is activated based on an up-scan signal and a column selection signal; and facilitate electric current flow through the first node based on a down-scan signal.

15. The memory device of claim 13, wherein the second base scan control circuit is configured to:

set the second node at a floating state during the first test mode;

drive the second node when the first column is selected during the second test mode; and set the second node at a floating state when the second column is selected during the second test mode.

16. The memory device of claim 13, wherein the first core die comprises:

a first core scan control circuit connected to a third node connected to a third through via included in the first column; and a second core scan control circuit connected to a fourth node connected to a fourth through via included in the second column; and wherein the first core scan control circuit is configured to set the third node at a floating state during one of the first test mode and the second test mode.

17. The memory device of claim 16, wherein the first core scan control circuit is configured to:

drive the third node, based on a core pull-up signal that is activated based on a mode signal, a down-scan signal, and a top signal; and facilitate electric current flow through the third node, based on a core pull-down signal that is activated based on an up-scan signal and the top signal.

18. The memory device of claim 16, wherein the second core scan control circuit is configured to set the fourth node at a floating state during one of the first test mode and the second test mode.

19. The memory device of claim 16, wherein the second core die comprises:

a third core scan control circuit connected to a fifth node connected to a fifth through via included in the first column; and a fourth core scan control circuit connected to a sixth node connected to a sixth through via included in the second column; and wherein the third core scan control circuit is configured to:

drive the fifth node during the first test mode;

set the fifth node at a floating state when the first column is selected during the second test mode; and drive the fifth node when the second column is selected during the second test mode.

20. The memory device of claim 19, wherein the first through via, the third through via, and the fifth through via are electrically connected to each other; and wherein the second through via, the fourth through via; and the sixth through via are electrically connected to each other.

21. The memory device of claim 19, wherein the third core scan control circuit is configured to:

drive the fifth node, based on a core pull-up signal that is activated based on a mode signal, a down-scan signal, and a top signal; and facilitate electric current flow through the fifth node, based on a core pull-down signal that is activated based on an up-scan signal and the top signal.

22. The memory device of claim 19, wherein the fourth core scan control circuit is configured to:

drive the sixth node during the first test mode;

drive the sixth node when the first column is selected during the second test mode; and set the sixth node at a floating state when the second column is selected during the second test mode.

23. The memory device of claim 13, further comprising a scan output circuit configured to:

output a current of the first node as a scan current when the first column is selected during one of the first test mode and the second test mode; and output a current of the second node as the scan current when the second column is selected during one of the first test mode and the second test mode.

24. A memory device comprising:

a base die;

a first die stacked over the base die and comprising a first plurality of nodes;

a second die stacked over the first die and comprising a second plurality of nodes including a first node and a second node;

a first plurality of through vias connected in a first column, wherein the first plurality of through vias comprises a first through via within the base die, a second through via within the first die, and a third through via connected to the first node within the second die; and a second plurality of through vias connected in a second column, wherein the second plurality of through vias comprises a fourth through via within the base die, a fifth through via within the first die, and a sixth through via connected to the second node within the second die;

wherein the second die is configured to drive the first node during a first test mode, set the first node at a floating state when the first column is selected during a second test mode, and drive the first node when the second column is selected during the second test mode;

wherein the first die is configured to set the first plurality of nodes at a floating state during one of the first test mode and the second test mode; and wherein the base die is configured to select the first column and output a first current flowing through the first column as a scan current and to select the second column and output a second current flowing through the second column as the scan current, wherein the scan current identifies any through via failures among the first plurality of through vias and the second plurality of through vias.

* * * * *